US009445293B2

United States Patent
Woodings

(10) Patent No.: US 9,445,293 B2
(45) Date of Patent: *Sep. 13, 2016

(54) MULTIPLE BAND PORTABLE SPECTRUM ANALYZER

(71) Applicant: MetaGeek, LLC, Boise, ID (US)

(72) Inventor: Ryan Winfield Woodings, Boise, ID (US)

(73) Assignee: METAGEEK, LLC, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/840,265

(22) Filed: Aug. 31, 2015

(65) Prior Publication Data

US 2015/0373570 A1    Dec. 24, 2015

Related U.S. Application Data

(63) Continuation of application No. 13/886,472, filed on May 3, 2013, now Pat. No. 9,143,952, which is a continuation of application No. 12/621,187, filed on Nov. 18, 2009, now abandoned.

(51) Int. Cl.
| | |
|---|---|
| *H04B 17/00* | (2015.01) |
| *H04M 1/00* | (2006.01) |
| *H04B 1/38* | (2015.01) |
| *H04W 24/08* | (2009.01) |
| *G01R 23/16* | (2006.01) |
| *H04W 24/00* | (2009.01) |

(52) U.S. Cl.
CPC .............. *H04W 24/08* (2013.01); *G01R 23/16* (2013.01); *H04W 24/00* (2013.01)

(58) Field of Classification Search
CPC ... H04W 4/008; H04W 92/04; H04W 24/00; H04W 24/08; H04B 1/006; H01Q 1/2275; H01Q 1/2283; H01Q 1/243
USPC ............ 455/67, 11, 226.1, 550.1–553.1, 558
See application file for complete search history.

(56) References Cited

U.S. PATENT DOCUMENTS

| | | |
|---|---|---|
| 6,313,874 B1 | 11/2001 | Bowyer et al. |
| 6,526,034 B1 | 2/2003 | Gorsuch |
| 6,778,519 B1 | 8/2004 | Harrell et al. |
| 6,844,846 B1 | 1/2005 | Riday |
| 6,992,990 B2 * | 1/2006 | Sakusabe ................. H03C 3/40 370/278 |
| 7,024,165 B2 | 4/2006 | Stepp et al. |
| 7,155,258 B1 | 12/2006 | Cisar |
| 7,251,499 B2 | 7/2007 | Ella et al. |
| 7,295,524 B1 | 11/2007 | Gray et al. |
| 7,313,368 B2 | 12/2007 | Wu et al. |
| 7,459,898 B1 | 12/2008 | Woodings |
| 7,617,342 B2 * | 11/2009 | Rofougaran ......... H01Q 1/2275 235/492 |
| 7,762,470 B2 | 7/2010 | Finn et al. |
| 7,773,967 B2 | 8/2010 | Smith |
| 7,859,534 B2 | 12/2010 | Fujii |
| 7,865,150 B2 * | 1/2011 | McFarland .......... H03H 7/0153 370/338 |
| 7,912,503 B2 | 3/2011 | Chang et al. |
| 7,974,577 B2 | 7/2011 | Stephens, Jr. |
| 7,991,056 B2 | 8/2011 | Hansen et al. |

(Continued)

*Primary Examiner* — Simon Nguyen
(74) *Attorney, Agent, or Firm* — Buchanan Nipper

(57) ABSTRACT

A device for detecting RF power information, for use as a stand alone purpose built device, or connectable to an external computing instrument such as a laptop, PDA, or cell phone, or other similarly capable technology. The device scans two or more bands in the wireless frequency and provides output to the user with wireless information about multiple bands of information.

20 Claims, 4 Drawing Sheets

(56) References Cited

U.S. PATENT DOCUMENTS

| | | |
|---|---|---|
| 8,228,849 B2 | 7/2012 | Trachewsky |
| 8,666,328 B2 | 3/2014 | Sanguinetti et al. |
| 8,706,124 B2 | 4/2014 | Kakani |
| 9,143,952 B2 | 9/2015 | Woodings |
| 2003/0013411 A1 | 1/2003 | Uchiyama |
| 2003/0050032 A1* | 3/2003 | Masaki .............. H01Q 1/243 |
| | | 455/272 |
| 2004/0095381 A1 | 5/2004 | McDowell |
| 2004/0198420 A1 | 10/2004 | He et al. |
| 2004/0259518 A1 | 12/2004 | Aktas et al. |
| 2004/0266378 A1 | 12/2004 | Fukamachi et al. |
| 2005/0113031 A1 | 5/2005 | Turner et al. |
| 2005/0119025 A1* | 6/2005 | Mohindra ............ H04B 1/0021 |
| | | 455/552.1 |
| 2005/0176420 A1 | 8/2005 | Graves et al. |
| 2006/0063523 A1 | 3/2006 | McFarland |
| 2006/0069840 A1 | 3/2006 | Corbett et al. |
| 2006/0079275 A1* | 4/2006 | Ella ..................... H04B 1/006 |
| | | 455/553.1 |
| 2006/0229035 A1 | 10/2006 | Fukamachi et al. |
| 2007/0140424 A1 | 6/2007 | Serceki |
| 2009/0206948 A1 | 8/2009 | Kemmochi et al. |
| 2009/0285135 A1* | 11/2009 | Rousu ................. H04B 1/0057 |
| | | 370/297 |
| 2010/0222010 A1 | 9/2010 | Ozaki et al. |
| 2010/0260082 A1* | 10/2010 | Lum ..................... H04B 1/48 |
| | | 370/297 |
| 2011/0096705 A1 | 4/2011 | Kemmochi et al. |
| 2011/0117869 A1 | 5/2011 | Woodings |

\* cited by examiner

MULTIPLE BAND PORTABLE SPECTRUM ANALYZER

CROSS-REFERENCE TO RELATED APPLICATIONS

This application is a continuation application of U.S. patent application Ser. No. 13/886,472, entitled "MULTIPLE BAND PORTABLE SPECTRUM ANALYZER", filed on May 3, 2013, now issued U.S. Pat. No. 9,143,952, which claims priority to U.S. patent application Ser. No. 12/621,187, entitled "MULTIPLE BAND PORTABLE SPECTRUM ANALYZER," filed on Nov. 18, 2009, the entire disclosure of which is hereby incorporated herein by reference.

BACKGROUND OF THE INVENTION

1. Field of the Invention

The invention generally relates to the field of spectrum analyzers, and more particularly to a mobile device which analyzes multiple bands of RF frequencies.

2. Background

Wireless networks operating under standard IEEE 802.11, also known as Wi-Fi, are wireless local area network (WLAN) technology commonly used for networking computers together. Wi-Fi can operate in either the 2.4 GHZ Industrial Scientific Medical (ISM) band, or in the 5 GHz band. The 2.4 GHz band is roughly 100 MHz wide. Within that band there are 14 channels that are 22 MHz wide. Due to frequency constraints in the 2.4 GHz ISM band, these Wi-Fi channels overlap each other. The 5 GHz band is 600 MHz wide with 25 channels. Also, the 2.4 and 5 GHz bands share frequencies with a number of other users such as cordless telephones, Bluetooth® devices, ZigBee® devices. To the 802.11 WLAN devices, these other devices may be viewed as interferers. These potential interference sources may cause difficulty with network communications.

When setting up a wireless network or troubleshooting network problems, it is necessary to learn what portions of the available radio frequencies, or bands, are free of interfering signals. The test instrument most commonly used for such a task is the spectrum analyzer. A spectrum analyzer scans, or 'sweeps' the desired range of frequencies, then normally plots the strengths of the signals received in the vertical axis against the scanned frequencies on the horizontal axis. The result of such a sweep is shown on a graphic display to enable a user to graphically see the spectrum that is analyzed. Spectrum analyzers are specialized test instruments that often cover broad ranges of frequencies. Conventional spectrum analyzers focus on features that enhance the accuracy of measurements, such as: sweep time, principles of the invention, resolution bandwidth and frequency range. These features often require specialized hardware. For instance, conventional spectrum analyzers typically contain dedicated hardware capable of quickly taking precise measurements. This specialized hardware is typically bulky and cost prohibitive for a small scale user, such as a small business, a personal computer user, or highly mobile technical support personnel. Conventional spectrum analyzers also lack certain spectrum display and data manipulation features, creating additional work for a user desiring a particular display or spectrum data manipulation. For example, conventional spectrum analyzers typically graph amplitude versus frequency, requiring users to mentally map channels utilized by devices onto the frequency axis. Furthermore, while conventional spectrum analyzers allow an image to be saved, the image is generally only a representation of a single instant in time.

Consequently, it would be desirable to provide a portable and inexpensive device for portable analyzing and troubleshooting the Wi-Fi spectrum.

U.S. Pat. No. 7,459,898 to Woodings discloses a System and Apparatus for Detecting and Analyzing a Frequency Spectrum. The apparatus is suitable for spectrum analysis in the 2.4 GHz radio frequency band. The apparatus is a small device that plugs into an available Universal Serial Bus (USB) port of a computing device such as a laptop computer. The result is a highly portable system that includes a 2.4 GHz radio system and hardware to support USB communications. The apparatus together with its companion software, which runs on the connected computer, functions as a spectrum analyzer. The software and the hardware apparatus are operated from the computer's graphical user interface (GUI). GUI's are a standard part of modern computer operating systems such as the common Microsoft® Windows operating systems.

What is needed is a small, portable, and inexpensive device that will perform spectrum analysis on at least the 2.4 and 5 GHz radio frequency bands. The device should work with a computer that has a GUI, and ideally existing software capable of spectrum analysis and display should be utilized.

SUMMARY

The invention is a device for detecting and analyzing the frequency spectrum of at least two distinct bands, the 2.4 GHz and 5 GHz bands. One embodiment of the present invention may comprise a portable hardware device including a 2.4 GHz radio system, together with hardware to convert signals in the 5 GHz band down to 2.4 GHz for detection by the 2.4 GHz radio system, thus allowing the device to detect signals in two bands with a single radio, or with two radios both reading the 2.4 GHz band. The radio system detects radio frequency (RF) power present across the scanned band. The device also includes a means to connect and communicate with a computing device, preferably a laptop computer, or possibly a cell phone, PDA, or other portable computing means. One means of communicating with computer is to use a Universal Serial Bus (USB) port and connector. The device should also be suitable for operation with existing software applications designed for radio frequency spectrum analysis.

The apparatus of the invention is a device for receiving and detecting radio frequency signals on at least two different bands, the 2.4 GHz and 5 GHz bands, for use with a computing device such as a laptop computer, cell phone, a PDA, or other portable computing devices, or as a stand alone purpose built device. The computing device used with the apparatus of the invention preferably includes a graphical user interface. The device includes a housing in which the components of the device are enclosed. It also includes an antenna which is attached to the housing or may be inside the housing, and is configured for receiving radio frequency signals. Included with one embodiment of the device is a switch for selecting a band of radio frequencys for detection. Once the wireless band is selected, the device is capable of routing signals from that band directly to a radio system for detection, or for sending the signals to a band pass filter.

The band pass filter passes signals in the desired frequency band of network signals and rejects all other signals. The device also includes a mixer for converting radio frequency signals to the particular band which may be received by the radio system. In one embodiment of the invention the band received by the radio system is 2.4 GHz. This particular frequency has advantages because radios for detecting this frequency of signals are relatively inexpensive.

The mixer in the device may be used to convert 5 GHz signals into 2.4 GHz. This conversion takes place because the preferred radio is a 2.4 GHz radio. By using the band pass filter and the mixer to filter out unwanted signals and convert desired signals to a frequency compatible with a single band radio, more than one band may be analyzed using that single band radio. An oscillator is provided with the device to provide local oscillator input which is required for the mixer to function.

The radio system thus includes at least one radio receiver, with that receiver configured to detect RF power in a single RF band. Certain configurations of the device can also perform the same function using two 2.4 GHz radios, with one receiving the 2.4 GHz band directly, and one receiving the 5 GHz band stepped down to 2.4 GHz.

A connector is provided which may be a USB connector for attaching the device to a computer, or could be other types of conventional connectors to attach to the preferred computing device, such as cables and connectors for PDAs and cell phones. The connector device allows the physical attachment of the device to the computing device, and provides for transfer of the commands and data between the computing device and the apparatus of the invention. The apparatus may also be powered through the connector.

The apparatus is thus configured to detect RF power on two or more radio frequency bands with the device configured to utilize radios capable of detection of only one band, but with the data input to the one or more radios being converted from other bands. The device would be configured to be switchable between reading a first band and a second band. The user may manually select a band or configure the device to automatically switch between the bands. When the device is switched to reading a first band, information about that selected band is displayed in the graphical user interface of the computing device. It is also possible for data about both bands to be displayed simultaneously, either from both bands being read simultaneously or sequentially as the device is switched from one band to the other.

The oscillator is a voltage controlled oscillator in which the output frequency is controlled by the micro-controller included in the radio system. The voltage controlled oscillator frequency may be varied to allow a narrow band radio to detect RF power across a broad band.

An additional embodiment of the present invention is a method for detecting and analyzing RF power on selected radio frequency bands. The method may comprise the following: 1) providing a small hardware device, which may comprise a radio system, a micro-controller, and memory, and be suitable for detecting RF power across frequency spectrum; 2) providing a computing device with a graphical user interface; 3) providing spectrum analysis software suitable for operation with the small hardware device; 4) connecting the small hardware device to the computing device; 5) selecting a wireless frequency band for spectrum analysis; 6) detecting RF power across the selected band; 7) transferring data to a computing device; 8) providing a graphical display of detected RF power across the selected band. The radio system is made up of one or more radios of a selected frequency such as 2.4 GHz radios. The system utilizes single band radio or radios to analyze two or more RF bands.

This invention is also a method for detecting and analyzing the frequency spectrum of at least two distinct bands using a portable device which incorporates one or more radios which are configured to analyze only one band. Typically, the radios would be one or more radios which detect and analyze signals in the 2.4 GHz band, but the method of the device results in using those radios to detect and analyze both 2.4 GHz and the 5 GHz bands, and other bands are additionally possible. The method involves the steps of connecting the portable device to a computing device. The next step is to receive RF signals at the portable device antenna. The antenna can be internal to the housing of the device, or it can be an external component of the device. The next step is to provide within the device a switch for selecting which band of radio frequency signals are to be analyzed by the device. If the 2.4 GHz band is to be detected, the switch would be positioned to route the signals directly to a radio system. If, for instance, the 5 GHz band is selected for detection, the switch would be set to route the signals to a band pass filter, which will only pass signals in the desired band. Next the signals passed by the band pass filter are routed to a mixer. In the mixer, signals from the band pass filter are combined with signals from the oscillator for conversion to the band received by the radio. This step is accomplished by adjusting the oscillator output so the mixer output is converted to be compatible with the radio. For example, the mixer step may result in 5 GHz signals being mixed with signals from the oscillator for down conversion to 2.4 GHz for analysis by a 2.4 GHz radio.

The next step of the method is providing a connector which allows the device to connect to a computing device. The computing device can be a laptop computer, a PDA, a cell phone, or other portable computing devices. The connector can be a USB connection or other connectors normally used in the industry at present, or those which may become standard connecting devices in the future.

The method of the invention can also comprise the step of providing a second radio, with the signals from the switch being routed to either the first radio or the second radio. Both the first radio and the second radio are configured to operate on the 2.4 GHz band, with RF power signals in the 2.4 GHz band being routed directly to the second radio, and being routed to the first radio after first being down converted from the 5 GHz band into the 2.4 GHz band.

The purpose of the Abstract is to enable the public, and especially the scientists, engineers, and practitioners in the art who are not familiar with patent or legal terms or phraseology, to determine quickly from a cursory inspection, the nature and essence of the technical disclosure of the application. The Abstract is neither intended to define the invention of the application, which is measured by the claims, nor is it intended to be limiting as to the scope of the invention in any way.

Still other features and advantages of the claimed invention will become readily apparent to those skilled in this art from the following detailed description describing preferred embodiments of the invention, simply by way of illustration of the best mode contemplated by carrying out my invention. As will be realized, the invention is capable of modification in various obvious respects all without departing from the invention. Accordingly, the drawings and description of the preferred embodiments are to be regarded as illustrative in nature, and not as restrictive in nature.

DESCRIPTION OF THE PREFERRED EMBODIMENTS

Figure 1:
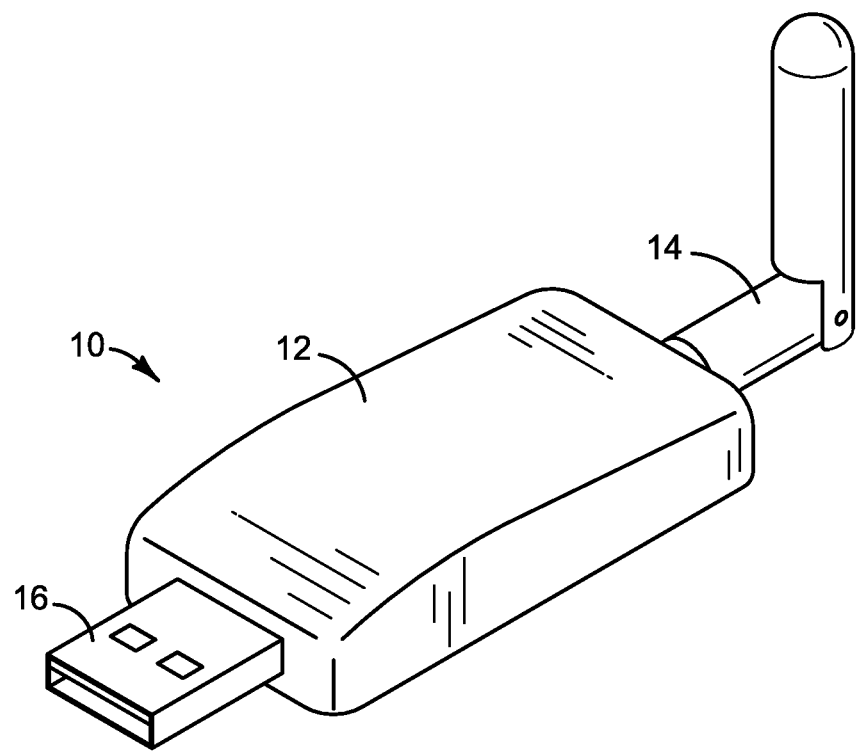
FIG. 1 is a perspective view of an embodiment of the present invention.

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims. In the following description and in the figures, like elements are identified with like reference numerals. The use of "e.g.," "etc," and "or" indicates non-exclusive alternatives without limitation unless otherwise noted. The use of "including" means "including, but not limited to," unless otherwise noted.

FIG. 1 is a perspective view of the apparatus for detecting and analyzing a frequency spectrum 10 is shown. The device includes a housing 12 to contain the circuitry and components of the apparatus. Antenna 14 is mounted to the internal board and may be inside or outside the housing. Connector 16 allows the apparatus to be plugged into an available port on a computing device. The computing device can be a laptop computer, or other computing device types could be utilized such as a cell phone, a PDA, or other computing means. Although a USB connector is shown in FIG. 1, other types of connectors could also be utilized with the device when connecting to different types of computing devices. Connector 16 may be a common type such as a USB connector or other common serial or parallel port connectors. While the antenna 14 shown in FIG. 1 is external to the housing, an internal antenna, however, may be used and located inside the apparatus housing 12. The apparatus housing 12 is a small device to facilitate ease of portable use.

Figure 2:
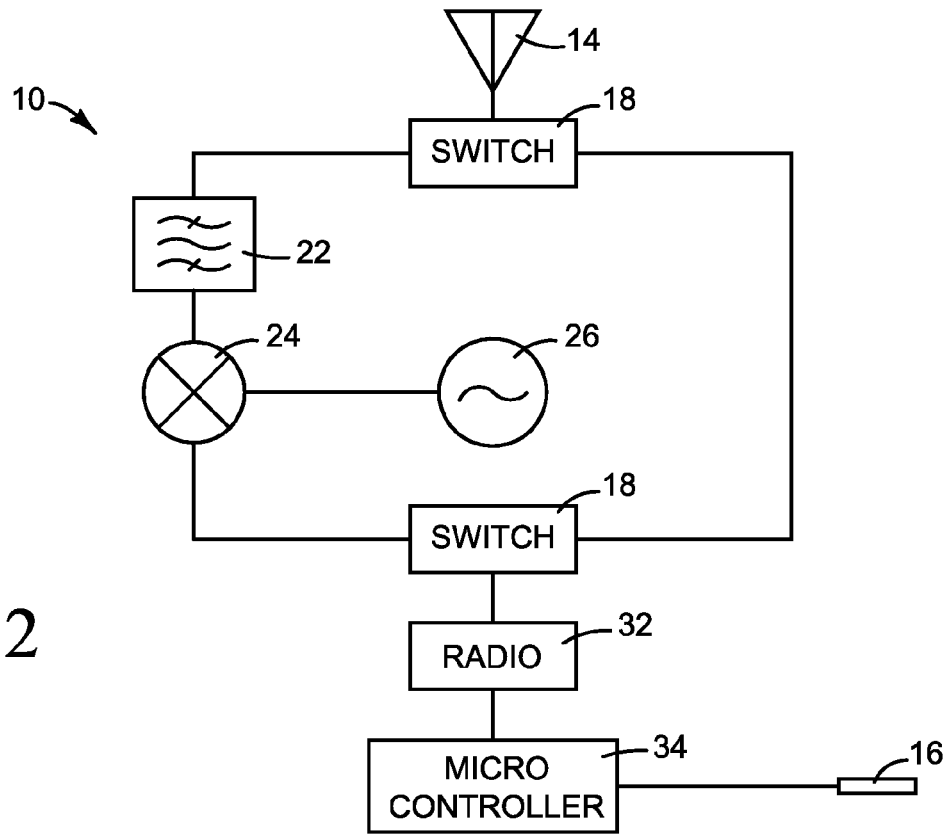
FIG. 2 is a block diagram of one embodiment of the present invention.

Referring now to FIG. 2, an embodiment of the present invention is illustrated. Antenna 14 for receiving signals is connected to a switch 18. This embodiment of the present invention includes two switches 18. One switch 18 is connected to the antenna; the second switch 18 is connected to the radio 32. The switches can be set to route signals from the antenna directly to the radio 32 or to a band pass filter 22. In the preferred embodiment the radio 32 is a 2.4 GHz radio, which receives signals in the 2.4 GHz band. If the signals to be analyzed are in the 2.4 GHz band received by the radio 32 they may be routed directly to the radio 32. If the signals to be analyzed are not in the band directly received by the radio 32, switches 18 are positioned to route those signals to band pass filter 22. Band pass filter 22 allows only signals in a selected band to pass on to the RF input of mixer 24. Oscillator 26 provides a signal to the local oscillator input of mixer 24. In the mixer 24 the signal at the RF input is mathematically multiplied together with the signal at the local oscillator input of the mixer 24, the mixer 24 creates an intermediate frequency signal output. The intermediate frequency signal has two component frequencies: 1) a down converted signal with a frequency equal to the RF input frequency minus the local oscillator frequency, and 2) an up converted signal with a frequency equal to the RF input frequency plus the local oscillator frequency. If for instance, radio 32 receives signals in the 2.4 GHz band and it is desired to use that radio 32 to analyze 5 GHz signals, the 5 GHz signals would be converted down to 2.4 GHz by the mixer 24, with input from the oscillator 26. The oscillator input to the mixer 24 is determined by the difference of the frequency desired to be received and the frequency received by the radio system.

By way of an example, if radio 32 receives 2.4 GHz signals and it is desired to receive signals from the 5 GHz band, signals from antenna 14 are routed through switch 18 to band pass filter 22. The band pass filter 22 would be designed to pass only signals in the 5 GHz band, any received 5 GHz signals will pass to the RF input of mixer 24. Oscillator 26 would be set to produce a signal that is 2.6 GHz and that 2.6 GHz signal is available at the local oscillator input of mixer 24 When mixer 24 processes the 5 GHz input signal and the 2.6 GHz local oscillator signal the resulting frequencies are 5-2.6 or 2.4 GHz and 5+2.6 or 7.6 GHz. The 2.4 GHz down converted signal output from intermediate frequency output of mixer 24 is sent to radio 32 through the second switch 18 to radio 32 where RF power on the down converted signal is detected.

Connector 16 allows the apparatus to be connected to a computer. The connection provided through connector 16 may supply power to the apparatus 10 as well as facilitating the exchange of data and commands between the apparatus 10 and the connected computer. Detected RF power data from radio 32 is processed by micro-controller 34 for transfer to the connected computer through connector 16.

Connector 16 maybe also be a fixed or semi-fixed type connector whereby the apparatus is connected to, or integrated into a portable computing device. The combination of the apparatus integrated with a portable computing device is a custom handheld apparatus for detecting and analyzing a frequency spectrum.

Figure 3:
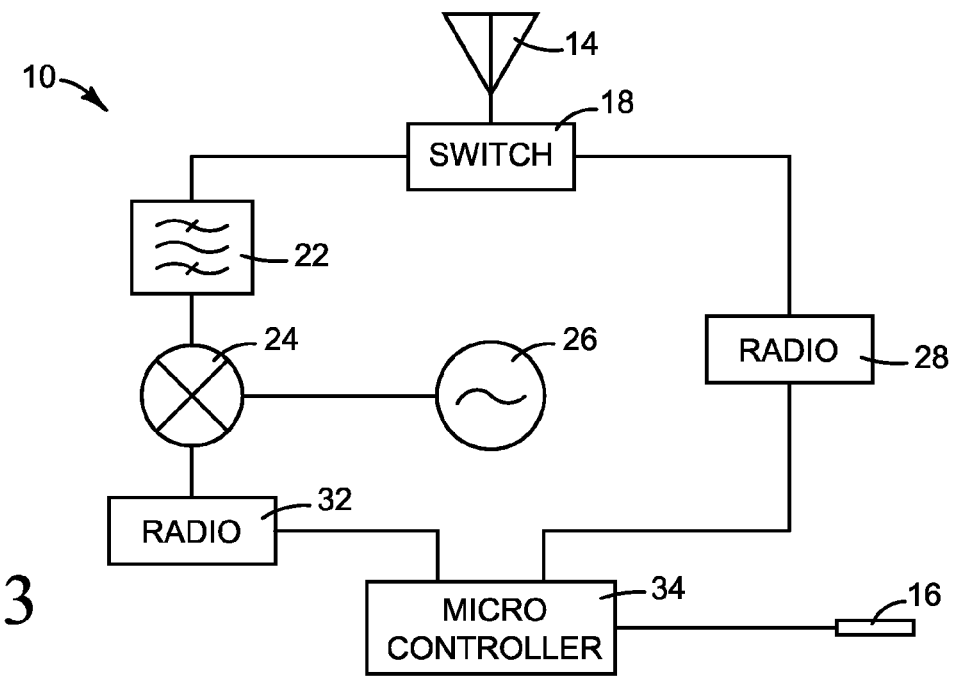
FIG. 3 is a block diagram of a second embodiment of the present invention.

FIG. 3 is a block diagram illustrating another embodiment of the present invention. This embodiment includes an antenna 14, switch 18, connector 16, band pass filter 22, mixer 24, and oscillator 26. In this embodiment, two radio systems are used. A first radio system 28 includes at least a receiver. An example of a radio that may be used as a first radio system 28 is a Texas Instruments CC2500 radio which receives signals in the 2.4 GHz band. A second radio system that includes at least a radio 32, a micro-controller 34, memory 36, and support hardware for a communications port 38. An example of a second radio system is a Texas Instruments CC2511 2.4 GHz radio system. In particular, the second radio system on this embodiment may include a USB port to allow connection with virtually all modern personal computing devices.

In operation, the embodiment shown in FIG. 3 includes antenna 14 to receive signals, and switch 18 is set to route the signals to the first radio 28 or to the band pass filter 22. If signals in the 2.4 GHz band are to be analyzed, switch 18 is set to route signals to first radio 28. The first radio receiver detects RF power in the 2.4 GHz band. The data detected by the first radio 28 includes a measure of relative RF power present across the analyzed band. The data from the first radio 28 is routed to second radio system micro-controller 34. Second radio system micro-controller 34 transfers the detected information transferred from the first radio system 28 to the connected computing device through connector 16. If it is desired to detect signals other than 2.4 GHz, switch 18 is set to route signals to the band pass filter 22. Band pass filter 22 is designed to pass signals in the desired band. As described in the discussion of FIG. 2, the oscillator 26 provides a local oscillator signal to the mixer 24. Mixer 24 then converts the received signals to 2.4 GHz for detection by the radio 32 of the second radio system. Detected data is then transferred through micro-controller 34 and is made available to the connected computer through connector 16.

If it is desired to simultaneously scan both bands, switch 18 would be alternately set to route signals to first radio 28 then to band pass filter 22 for analysis. In this manner two bands may be analyzed simultaneously by sharing antenna 14. To accomplish this simultaneous analysis of two bands, switch 18 would be controlled from the connected computing device using the graphic user interface to command the needed automatic switch 18 operation.

Figure 4:
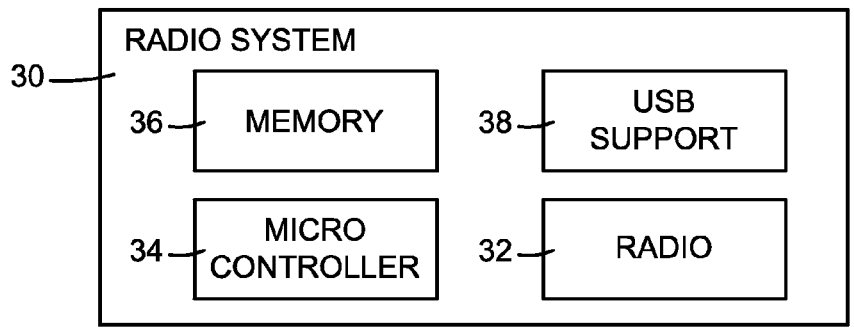
FIG. 4 is a block diagram of a radio system used in the present invention.

FIG. 4 illustrates a block diagram of the major components of radio system 30. The radio system 30 includes at least a radio 32. That radio is comprised of at least a receiver and in the preferred embodiment the radio is a 2.4 GHz transceiver. The second radio system also includes a micro-controller 34, memory 36, and hardware to support a USB port connection 38. The radio system 30 of FIG. 4 would be utilized in the devices of FIGS. 2, 3 and 5.

Figure 5:
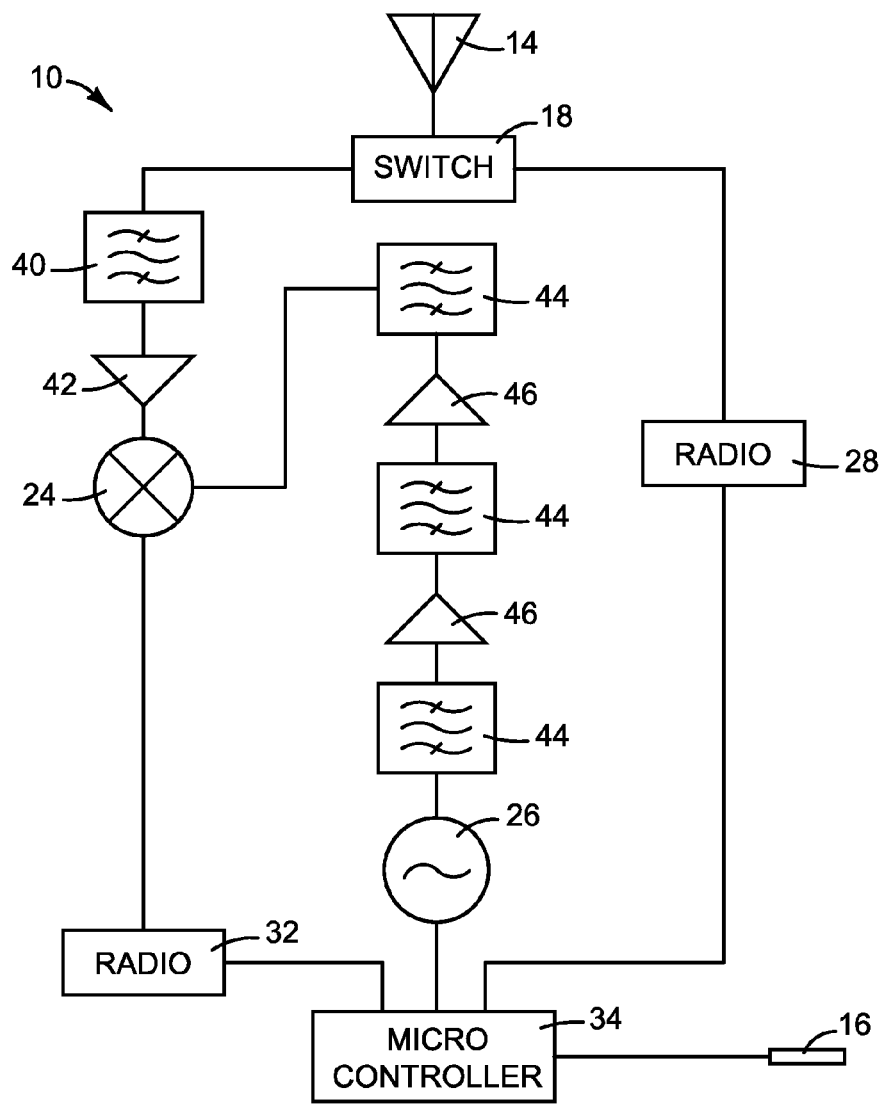
FIG. 5 is a block diagram of the preferred embodiment of the present invention.

Referring now to FIG. 5 a block diagram of the preferred embodiment is shown. The preferred embodiment is designed to detect and analyze signals in the 2.4 and 5 GHz radio frequency bands. This embodiment includes an antenna 14, and switch 18. In this embodiment, switch 18 is a solid state switch controlled by the micro-controller 34 in the second radio system. Switch 18 can be set to route signals received at antenna 14 to either first radio system 28, or to first band pass filter 40. When the switch is set to route signals to the first radio system 28 the detector in the first radio system 28 detects RF power in the 2.4 GHz radio frequency band received by the antenna. Detected 2.4 GHz information is transferred to the micro-controller 34 of the second radio system where it can be processed and transferred to a connected computer through connector 16.

If it is desired to detect and analyze 5 GHz signals, switch 18 is set to route signals received by the antenna 14 to the first band pass filter 40. The radio frequency signals from first band pass filter 40 are sent to a first amplifier 42. The first amplifier 42 is a low noise amplifier with the function of restoring signal strength lost due to attenuation in first band pass filter 40, without corrupting the signal to be analyzed. From first amplifier 42 the signal is sent to the RF input of mixer 24. Oscillator 26 produces a local oscillator signal for use with mixer 24. In this embodiment, the oscillator 24 is an integrated voltage controlled oscillator and phase locked loop. Second band pass filters 44 remove unwanted noise from the oscillator 26 output. Second amplifiers 46 increase the amplitude of the local oscillator signal for use by the mixer 24. In the preferred embodiment there are three stages of second band pass filters 44 and two second amplifiers 46. Selection of alternate filters or amplifiers may increase or decrease the number of filter and amplifier stages required to present a local oscillator signal of the desired quality and strength to the local oscillator input of mixer 26. Integrated oscillator 26 is controlled by the micro-controller 34 in the second radio system.

The second radio system includes a 2.4 GHz radio 32 which receives wireless signals and detects RF power in the 2.4 GHz band. Therefore, the 5 GHz wireless radio signals received at the antenna and routed through switch 18 to first band pass filter 40 are converted down in the mixer to 2.4 GHz for detection by radio 32 in the second radio system. To detect signals across the 600 MHz wide band 5 GHz RF band with a 2.4 GHz radio that operates in a 100 MHz wide RF band, the local oscillator signal presented to mixer 24 is sequentially stepped 100 MHz at a time so that the intermediate frequency output from mixer 24 presents, in a piece wise fashion, the 600 MHz wide frequency spectrum of the 5 GHz radio frequency band to the 100 MHz wide 2.4 GHz receiver. In an alternate embodiment the output signal from oscillator 26 could be swept continuously across the 600 MHz wide local oscillator frequency required to down convert the 5 GHz radio frequency band for detection in the 2.4 GHz radio 32. Detected information is sent to the computing device by way of connector 16. The piece wise data detected by the 2.4 GHz radio 32 is processed for display on the connected computing device as a continuous 5 GHz radio frequency band spectrum if desired.

Figure 6:
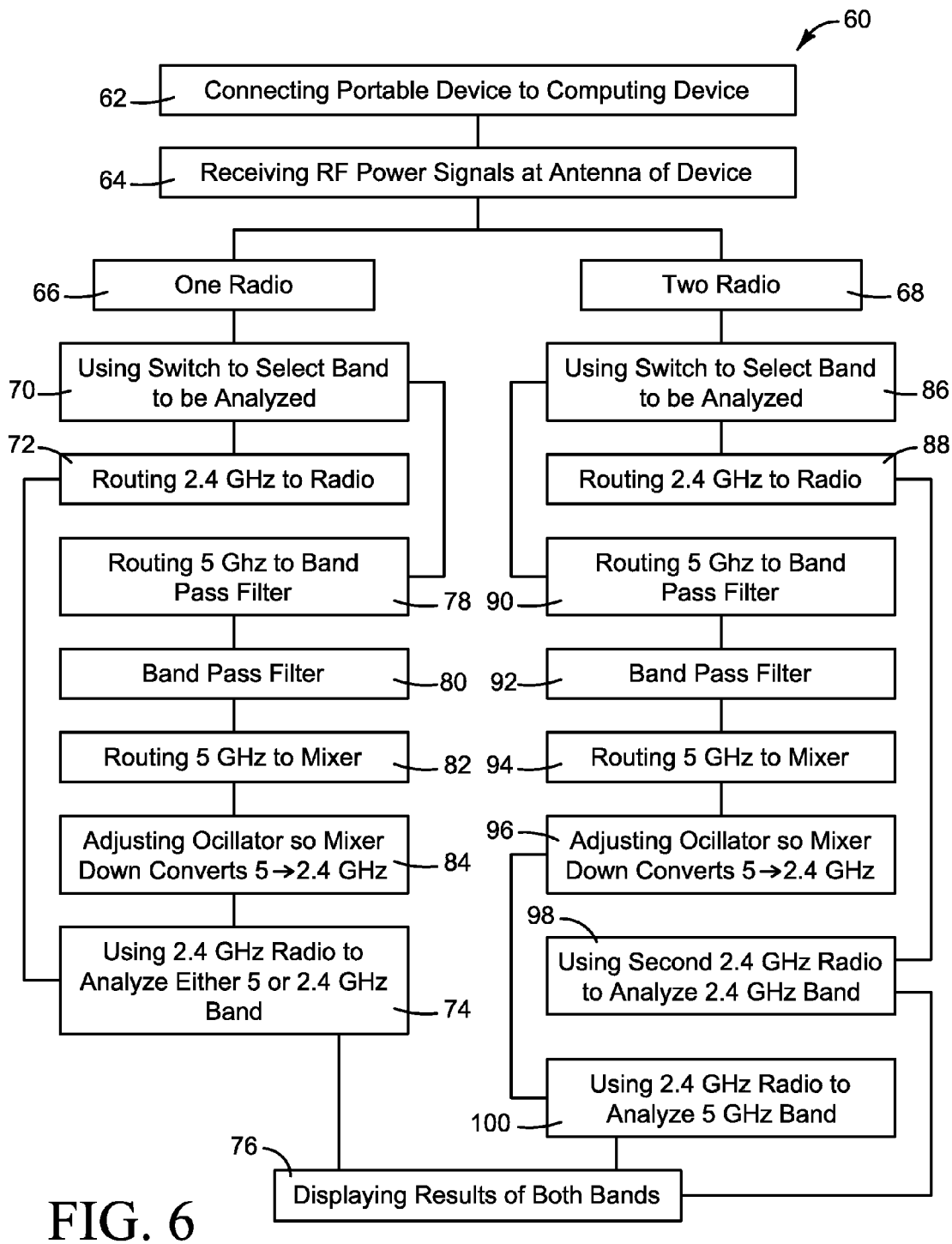
FIG. 6 is a flow chart of the method of the invention.

The method for detecting and analyzing the frequency spectrum of at least two distinct bands using a portable device is shown in FIG. 6. The method 60 involves using a portable RF power signal analyzer to analyze multiple RF bands. The method 60 begins with the step of connecting the portable device to a computing device 62. The next step in method 60 is the step of receiving RF power signals at the antenna of the portable device 64. From that point the method diverges into one of the embodiments shown in FIG. 6. One embodiment involves use of a device with a single radio 66, and another embodiment involves use of a device with two radios 68. Each of these embodiments analyzes the 2.4 and the 5 GHz bands.

In the one radio embodiment 66, the switch is used to select a band to be analyzed 70. To analyze 2.4 GHz signals, the switch is set to route 2.4 GHz band signals to the radio 72. After routing to the radio, the next step is using the 2.4 GHz radio to analyze RF power in the 2.4 GHz band 74. The results of analysis are graphically displayed on the computing device to which the portable device is attached 76. Attachment would typically be a USB port, but other connection protocols and devices may also be utilized as they become available in the industry.

As an alternative to reading the 2.4 GHz band, the switch may be set to route 5 GHz signals to the band pass filter 78. The band pass filter 80 only passes signals in the 5 GHz band. 5 GHz signals are the routed to the mixer 82. The oscillator is adjusted to provide signal to the mixer such that the mixer down converts the 5 GHz signals to 2.4 GHz 84. The next step is analyzing the 2.4 GHz down converted signals from the mixer to the 2.4 GHz radio 74. The step after analysis is displaying the result graphically on the computing device to which the portable device is attached 76.

In the case of a two radio embodiment 68, the switch is used to select either the 2.4 GHz or 5 GHz band for analysis 86. If the 2.4 GHz signals are selected to be analyzed first, the next step is routing the 2.4 GHz signal from the antenna to one of the two 2.4 GHz radios 88. That radio is designated as the second radio 98. The second radio 98 is a 2.4 GHz radio which analyzes RF power signals in the 2.4 GHz band. Results of the analysis of the 2.4 GHz band are displayed on the graphic display of the computing device 76.

After analyzing the information for the 2.4 GHz band, the next step is to adjust the switch to select the 5 GHz band 86. Then, the next step is to route the 5 GHz signal to the band pass filter 90. In the band pass filter step 92, all but the 5 GHz signals are removed, then the 5 GHz signals are routed to the mixer 94. The oscillator is adjusted to provide a signal to the mixer so the mixer down converts the 5 GHz signals to 2.4 GHz 96. From the mixer the 2.4 GHz band is routed to another 2.4 GHz radio, designated the first radio 100, which then analyzes RF power in the 5 GHz band. Following analysis in the first radio 100, results are passed on to the computing device for graphic display 76.

While there is shown and described the present preferred embodiment of the invention, it is to be distinctly understood that this invention is not limited thereto but may be variously embodied to practice within the scope of the following claims. From the foregoing description, it will be apparent that various changes may be made without departing from the spirit and scope of the invention as defined by the following claims.

What is claimed is:

1. A system for receiving and detecting radio frequency signals on at least two different bands, comprising:
    an apparatus for detecting RF power on two or more radio frequency bands and that is configured to be connected to a computing device, the apparatus including:
        a housing for enclosing components of the apparatus,
        an antenna attached to the housing for receiving radio frequency signals,
        a band pass filter for selecting a radio frequency band,
        a switch for selecting a band of radio frequency signals for detection by sending signals directly from the antenna to a radio system for detection when in a first position, and to the band pass filter when in a second position,
        a mixer for down converting the radio frequency signals to a band received by the radio system,
        the radio system comprising at least a first radio receiver configured to detect RF power in a single radio frequency band,
        wherein the apparatus determines the RF power of a first radio frequency band with the first radio receiver by routing via the switch first radio frequency band signals from the antenna to the radio system,
        wherein the apparatus determines the RF power of a second radio frequency band with the first radio receiver by routing via the switch second radio frequency band signals from the antenna through the band pass filter for down conversion then through the mixer in which the second radio frequency band signals are converted to the first radio frequency band whereby the radio system can detect the second radio frequency band signals, and
        a connector configured for removable connection to the computing device for exchanging commands and data between the apparatus and the computing device.

2. The system of claim 1, wherein:
    the radio system further comprises a least a 2.4 GHz radio receiver, a microcontroller, memory, and at least one port configured for communication with a USB port on the computing device.

3. The system of claim 2, further comprising:
    an oscillator for generating a local oscillator signal for the mixer, for defining a frequency of signals passed by the mixer, and
    wherein the oscillator is a voltage controlled oscillator and an output frequency of the voltage controlled oscillator is controlled by the microcontroller; wherein the voltage controlled oscillator frequency is varied to allow a narrow band radio to scan a broad band.

4. The system of claim 1, in which the mixer is configured to down convert signals in the 5 GHz band to 2.4 GHz for RF power detection by the radio system.

5. The system of claim 1, in which the first radio receiver has a capacity to detect RF power in approximately a bandwidth of 100 MHz in the 2.4 GHz band.

6. The apparatus of claim 1, further comprising:
    an oscillator for generating a local oscillator signal for the mixer, for defining frequency of signals passed by the mixer, and
    wherein oscillator output is stepped in increments, for scanning a full width of the second radio frequency band in an incremental manner, for RF power detection by the first radio receiver with a bandwidth at least as wide as the stepped increments.

7. The apparatus of claim 6, wherein the oscillator output is stepped in 100 MHz increments, for scanning the full width of the 5 GHz band in an incremental manner, for RF power detection by the first radio receiver with a 100 MHz bandwidth.

8. The apparatus of claim 1, which further comprises a second radio including a second radio receiver for detecting RF power in the 2.4 GHz band, with a signal from the antenna being routable to the second radio for detection of RF power in the 2.4 GHz band, and with the signal from the antenna being routable to the mixer for down conversion to 2.4 GHz and an then routed to the second radio receiver for detection of RF power in the 5 GHz band in the 2.4 GHz.

9. The apparatus of claim 1, further comprising:
    a computing device including a graphical user interface, wherein the computing device is configured to display the data received from the apparatus.

10. The system of claim 9, in which the computing device comprises a separate device configured to interface with the apparatus for receiving and detecting the radio frequency signals on the at least two different bands.

11. An apparatus for receiving and detecting radio frequency signals on at least two different bands, for use with a computing device, the apparatus comprising:
    a housing for enclosing components of the apparatus;
    an antenna attached to the housing for receiving radio frequency signals;
    a band pass filter for selecting a radio frequency band;
    a switch for selecting a band of radio frequency signals for detection by sending signals directly to a radio system for detection when in a first position and to the band pass filter when in a second position;
    the radio system comprising at least a 2.4 GHz first radio receiver, a microcontroller, memory, the 2.4 GHz first radio receiver detects RF power in a single radio frequency band;
    a mixer for down converting signals in the 5 GHz band to 2.4 GHz for RF power detection by the 2.4 GHz first radio receiver; and
    a connector attached to the housing and configured for removable attachment to the computing device, the connector for transfer of detected network information from the radio system to the computing device and configured to exchange commands and data with the computing device,
    wherein the apparatus determines the RF power of a 2.4 GHz radio frequency band by routing via the switch first radio frequency band signals from the antenna to the 2.4 GHz first radio receiver of the radio system, and
    wherein the apparatus determines the RF power of a 5 GHz radio frequency band by routing via the switch second radio frequency band signals from the antenna through the band pass filter for down conversion then through the mixer in which the second radio frequency band signals are converted to the 2.4 GHz radio frequency band and then to the 2.4 GHz first radio receiver of the radio system to detect the converted second radio frequency band signals.

12. The apparatus of claim 11, in which the 2.4 GHz first radio receiver has a capacity to detect RF power in approximately a bandwidth of 100 MHz in the 2.4 GHz band.

13. The apparatus of claim 11, further comprising:
an oscillator for generating a local oscillator signal for the mixer, for defining frequency of signals passed by the mixer, and
wherein oscillator output is stepped in increments, for scanning a full width of the 5 GHz radio frequency band in incremental manner, for RF power detection by the 2.4 GHz first radio receiver with a bandwidth at least as wide as the stepped increments.

14. The apparatus of claim 13, wherein the oscillator output is stepped in 100 MHz increments, for scanning the full width of the 5 GHz band in incremental manner, for RF power detection by the 2.4 GHz first radio receiver with a 100 MHz bandwidth.

15. The apparatus of claim 11, which further comprises a 2.4 GHz second radio receiver for detecting RF power in the 2.4 GHz band, with a signal from the antenna being routable to the 2.4 GHz second radio receiver for detection of RF power in the 2.4 GHz band, and with the signal from the antenna being routable to the mixer for down conversion to 2.4 GHz and then routable to the 2.4 GHz second radio receiver for detection of RF power in the 5 GHz band in the 2.4 GHz.

16. An apparatus for receiving and detecting radio frequency signals on at least two different bands that is configured to be connected to a computing device, the apparatus comprising:
a housing for enclosing components of the apparatus;
an antenna attached to the housing for receiving radio frequency signals;
a band pass filter for selecting a radio frequency band;
a switch for selecting a band of radio frequency signals for detection by sending signals to a first radio receiver for detection or to the band pass filter before routing to a first radio;
a mixer for down converting the radio frequency signals to a band received by a radio system;
the radio system comprising the first radio receiver configured to detect RF power in the 2.4 GHz band, with a signal from the antenna being routable to the first radio receiver for direct detection of RF power in the 2.4 GHz band, and with the signal from the antenna being routable to the mixer for down conversion from the 5 GHz band to 2.4 GHz, for detection of RF power in the 5 GHz band by the first radio receiver; and
a connector attached to the housing and configured for removable attachment to the computing device, the connector transfers detected network information from the radio system to the computing device and exchanges commands and data with the computing device.

17. The apparatus of claim 16, in which the first radio receiver has a capacity to detect RF power in approximately a bandwidth of 100 MHz in the 2.4 GHz band.

18. The apparatus of claim 16, further comprising:
an oscillator for generating a local oscillator signal for the mixer, for defining the frequency of the signals passed by the mixer, and
wherein oscillator output is stepped in increments, for scanning a full width of the 5 GHz band in incremental manner, for RF power detection by the first radio receiver with a bandwidth at least as wide as the stepped increments.

19. The apparatus of claim 18, wherein the oscillator output is stepped in 100 MHz increments, for scanning the full width of the 5 GHz band in incremental manner, for RF power detection by the first radio receiver with a 100 MHz bandwidth.

20. The apparatus of claim 16, which further comprises a second radio receiver for detecting RF power in the 2.4 GHz band, with the signal from the antenna being routable to the second radio receiver for detection of RF power in the 2.4 GHz band, and with the signal from the antenna being routable to the mixer for down conversion to 2.4 GHz and then routable to the second radio receiver for detection of RF power in the 5 GHz band in the 2.4 GHz.

* * * * *